United States Patent
Poustie

(10) Patent No.: US 10,243,327 B2
(45) Date of Patent: Mar. 26, 2019

(54) OPTICAL SOURCE

(71) Applicant: Rushmere Technology Limited, Bury St. Edmonds, Suffolk (GB)

(72) Inventor: Alistair James Poustie, Ipswich (GB)

(73) Assignee: Rushmere Technology Limited, Bury St. Edmonds (*) Notice: Subject to any disclaimer, the term of this patent is extended or adjusted under 35 U.S.C. 154(b) by 405 days.

(21) Appl. No.: 14/908,918

(22) PCT Filed: Jul. 30, 2014

(86) PCT No.: PCT/GB2014/052326
§ 371 (c)(1),
(2) Date: Jan. 29, 2016

(87) PCT Pub. No.: WO2015/015193
PCT Pub. Date: Feb. 5, 2015

(65) Prior Publication Data
US 2016/0164255 A1 Jun. 9, 2016

(30) Foreign Application Priority Data

Jul. 30, 2013 (GB) .................... 1313550.4

(51) Int. Cl.
*H01S 5/00* (2006.01)
*H01S 5/14* (2006.01)
(Continued)

(52) U.S. Cl.
CPC ............ *H01S 5/141* (2013.01); *H01S 3/1062* (2013.01); *H01S 5/0654* (2013.01);
(Continued)

(58) Field of Classification Search
CPC .... H01S 5/06255; H01S 5/141; H01S 5/0656; H01S 5/14; H01S 5/06246; H01S 5/06821; H01S 5/0654; H01S 2301/163
See application file for complete search history.

(56) References Cited

U.S. PATENT DOCUMENTS 6,282,340 B1 8/2001 Nasu et al.
6,496,523 B1 12/2002 Wach et al.
(Continued)

FOREIGN PATENT DOCUMENTS

EP 1074519 A2 2/2001
EP 1533875 A1 5/2005
(Continued)

OTHER PUBLICATIONS

Intellectual Property Office of United Kingdom, United Kingdom Application No. GB1313550.4, Examination Report dated Sep. 4, 2017, pp. 6.
(Continued)

*Primary Examiner* — Kinam Park
(74) *Attorney, Agent, or Firm* — Kilpatrick Townsend & Stockton LLP

(57) ABSTRACT

An optical source is presented comprising a laser and an optical filter in optical communication with the laser. The laser comprises an optical gain section; and an optical phase control section. The filter is configured to receive light output from the laser and filter the said received light. The source is configured to input the filtered light back into the laser.

15 Claims, 3 Drawing Sheets

(51) Int. Cl.
  *H01S 5/065* (2006.01)
  *H01S 5/062* (2006.01)
  *H01S 3/106* (2006.01)
  *H01S 5/0625* (2006.01)
  *H01S 5/40* (2006.01)

(52) U.S. Cl.
  CPC ........ *H01S 5/0656* (2013.01); *H01S 5/06246* (2013.01); *H01S 5/06255* (2013.01); *H01S 5/14* (2013.01); *H01S 5/142* (2013.01); *H01S 5/4031* (2013.01); *H01S 5/4068* (2013.01); *H01S 2301/163* (2013.01)

(56) References Cited

U.S. PATENT DOCUMENTS

| | | | |
|---|---|---|---|
| 2005/0018743 A1* | 1/2005 | Volodin | G02B 27/0944 372/102 |
| 2005/0123008 A1 | 6/2005 | Daiber et al. | |
| 2005/0213618 A1* | 9/2005 | Sochava | H01S 5/06255 372/20 |
| 2006/0023757 A1* | 2/2006 | Mooradian | H01S 5/141 372/18 |
| 2006/0215713 A1 | 9/2006 | Flanders et al. | |
| 2008/0291957 A1 | 11/2008 | Arimoto et al. | |
| 2011/0216789 A1* | 9/2011 | Docter | H01S 5/06256 372/20 |
| 2011/0233379 A1 | 9/2011 | Sekiguchi et al. | |
| 2012/0162662 A1 | 6/2012 | Johnson et al. | |
| 2012/0219023 A1* | 8/2012 | Cahill | H01S 5/141 372/20 |

FOREIGN PATENT DOCUMENTS

| | | |
|---|---|---|
| EP | 1986293 | 10/2008 |
| JP | 11-307879 A | 11/1999 |
| JP | 2006222305 A | 8/2006 |
| JP | 2007294883 A | 11/2007 |
| WO | 0111739 | 2/2001 |
| WO | 03005501 | 1/2003 |
| WO | 2005101595 | 10/2005 |
| WO | 2006/105249 A1 | 10/2006 |
| WO | 2009017398 | 2/2009 |

OTHER PUBLICATIONS

Japanese Patent Office, Japanese Patent Application No. 2016-530606, Office Action dated Nov. 2, 2017, pp. 6.
Shenping, L., et al., "Wavelength tuning in self-seeded gain-switched Fabry-Perot laser diode with Moiré grating," Electronics Letters, 1999, 35(25):2209-2210.
Great Britain Patent Application No. 1313550.4, Search Report dated Nov. 7, 2013, 4 pages.
Labaziewica et al., "Compact, Filtered Diode Laser System for Precision Spectroscopy", Optics Letters, Optical Society of America, U.S., vol. 32, No. 5, Mar. 1, 2007, pp. 572-574.
Li et al., "Fast Wavelength Tuning of a Self-Seeded Fabry-Perot Laser Diode With a Fabry-Perot Semiconductor Filter", IEEE Photonics Technology Letters, IEEE Service Center, Piscataway, NJ, U.S., vol. 13, No. 12, Dec. 1, 2001, pp. 1364-1366.
Li et al., "Self-Seeding of Fabry-Perot Laser Diode for Generating Wavelength-Tunable Chirp-Compensated Single-Mode Pulses with High-Sidemode Suppression Ratio", IEEE Photonics Technology Letters, IEEE Service Center, Piscataway, NJ, U.S., vol. 12, No. 11, Nov. 1, 2000, pp. 1441-1443.
Li et al., "Wavelength tuning in self-seeded gain-switched Fabry-Perot laser diode with Moire grating", Electronics Letters, IEE Stevenage, GB, vol. 35, No. 25, Dec. 9, 1999, pp. 2209-2210.
International Patent Application No. PCT/GB2014/052326, "International Search Report and Written Opinion" dated Sep. 26, 2014, 10 pages.
GB1313550.4, "Examination Report under Section 18(3)", dated May 30, 2017.
Japanese Patent Application No. 2016-530606, Decision of Rejection dated Aug. 6, 2018.

* cited by examiner

OPTICAL SOURCE

CROSS-REFERENCE TO RELATED APPLICATIONS

This is a U.S. national phase under 35 U.S.C. 371 of International Patent Application No. PCT/GB2014/052326, titled "OPTICAL SOURCE" and filed Jul. 30, 2014, which claims priority to United Kingdom Patent Application No. 1313550.4 filed Jul. 30, 2013, each of which is incorporated herein by reference in its entirety.

TECHNICAL FIELD

The present invention relates to an optical source configured to obtain wavelength control in a single or plurality of optical emitters.

BACKGROUND

With increasing demand for data capacities and bandwidth, optical technologies have been successfully developed to facilitate high-capacity transmission of optical data over optical fibre networks. These long-haul networks often use dense wavelength division multiplexing (DWDM) to allow one or more optical sources with different wavelengths to traverse a single optical fibre. Short-haul optical interconnect networks can also use DWDM techniques to increase the data capacity in fibre networks. The networks require stable control of the optical source wavelength in order to keep the optical signal within the passband of one or more optical filters within the DWDM network. A known solution to maintain the wavelength of a DWDM optical source is to design the optical source to emit a single longitudinal mode output, such as a distributed feedback laser (DFB) laser, and then control its wavelength by temperature or electrical current injection in the device. Other complex laser chip designs can be used to achieve wide tunability of the laser wavelength across many wavelengths. However, these methods of wavelength control are one of the major contributions to the electrical power consumption of the optical source and the necessity for cooling restricts the faceplate density of these sources in electrical equipment such as routers and switches. In addition, a DWDM laser device such as a DFB or tuneable laser is complex to fabricate and the yield of fabricated devices at a specified DWDM wavelength is low, leading to a high cost of the laser chip.

The use of injection locking and injection seeding to modify the spectral performance of a Fabry-Perot semiconductor laser has been shown (e.g. Optics Express, Vol. 15, No. 6, p. 2954, 2007) but these demonstrations do not use the incorporation of a phase section in the laser. Alternatively, using distant reflections to wavelength stabilise the laser spectral output have been shown (Optical Fibre Communications 2011, paper OMP4, IEEE PHOTONICS TECHNOLOGY LETTERS, VOL. 24, NO. 17, p. 1523, Sep. 1, 2012). These multi-wavelength schemes use a shared reflector after a wavelength selective filter but rely on the large distance to de-phase the reflected light with respect to the original laser light.

The use of one or more contacts on a semiconductor laser has been demonstrated, as in IEEE Journal of Selected Topics in Quantum Electronics, Vol. 10, p. 982, 2004, but only to modify the modulation performance of the laser, not to adjust the mode frequencies as in this application.

The use of an external cavity incorporating a filter to modify the spectral response of a laser has been shown in U.S. Pat. No. 6,496,523, but again this does not include the use of a phase section in the laser to tune the mode frequencies with respect to the filter frequency.

Wavelength selectivity improvements in Fabry-Perot semiconductor lasers for wavelength-division multiplexed passive optical networks (WDM-PON) have been demonstrated using external sources to seed either amplified spontaneous emission (H. D. Kim, S. G. Kang, and C. H. Lee, "A low-cost WDM source with an ASE injected Fabry-Perot semiconductor laser," IEEE Photonics Technol. Lett. Vol. 12, pp. 1067-1069, (2000)) or continuous wave light ("High-speed WDM-PON using CW injection-locked Fabry-Perot laser diodes", Zhaowen Xu, Yang Jing Wen, Wen-De Zhong, Chang-Joon Chae, Xiao-Fei Cheng, Yixin Wang, Chao Lu, and Jaya Shankar, Optics Express, Vol. 15 No. 6, p. 2953, (2007)). In these examples, there is no monitoring and feedback to control the laser wavelengths.

SUMMARY

In one aspect of the present invention there is provided an optical source comprising: a laser comprising: an optical gain section; and, an optical phase control section in optical communication with the gain section, and configured to be able to change the longitudinal mode frequency of the laser; and, an optical filter external to and in optical communication with the laser and configured to: receive light output from the laser; filter the said received light; wherein the optical source is configured to input the filtered light back into the laser.

The said aspect of the invention may be modified with and/or further comprise any of the following features as described herein.

The laser may comprises a laser cavity section disposed between a first optical reflector and a second optical reflector, the laser cavity section comprising the optical gain section and optical phase control section.

The optical source may be configured such that: at least one of the first or second optical reflectors is a partial optical reflector; and, the optical filter is configured to receive laser light from one of the said at least one partial optical reflectors; and, the optical source is configured to input filtered light into one of the said at least one partial optical reflectors.

The optical phase control section may be controllable independently from the gain section.

The optical phase control section or gain sections may be electronically controllable.

The optical gain section may comprise a semiconductor material.

The optical phase control section may comprise a semiconductor material.

The semiconductor material of the optical phase section may comprise a larger band gap than the gain section semiconductor material.

The first reflector may be a partial reflector and configured to: output a portion of the laser light to the filter; and, receive the filtered laser light from the filter.

The optical source may further comprise a third optical reflector external to the laser and configured to: receive filtered laser light from the optical filter; and, reflect filtered laser light back towards the optical filter.

The third optical reflector may be a partial reflector such that it is configured to transmit a portion of the light as an output of the laser source.

The third optical reflector may reflect substantially all the filtered light back to the optical filter; and, the second optical reflector may be a partial optical reflector configured to transmit a portion of the light as an output of the laser source.

The first reflector may be a partial reflector and is configured to output a portion of the laser light to the filter; and, the second reflector may be a partial reflector and is configured to receive a portion of the filtered laser light from the filter.

The optical filter may comprise a passband filter response.

The filter bandpass full width half maximum width may be less than the longitudinal mode spacing of the laser.

The optical filter may comprise an optical thin film filter.

The optical source may be configured to change the central wavelength of the pass-band response of the optical filter.

The optical source may be configured to change the said central wavelength of the pass-band response by changing the angle of incidence that the output laser light subtends with the thin film filter.

The optical source may comprise a plurality of said lasers, wherein the optical filter comprises a multi-wavelength optical filter comprising a plurality of optical pass-bands.

The filter may be configured to receive light from a plurality of physically separate light paths, wherein each said light path is associated with a different optical passband; and, each of the plurality of lasers is in optical communication with a different light path.

The optical filter comprises an arrayed waveguide grating, (AWG).

The optical source may comprise a third optical reflector; and, the AWG may comprise a wavelength multiplexed output path in optical communication with the third reflector; and the third optical reflector may be configured to receive filtered laser light from the multiplexed output of the AWG and reflect at least a portion of the said filtered light back into the multiplexed output of the AWG.

A further optical filter may be inserted in the optical path between, and in optical communication with, the plurality of lasers and the multi-wavelength filter.

The optical filter may be athermalised.

The optical filter may comprise athermalising means.

The laser may be athermalised.

The laser may comprise athermalising means.

The athermalising means may comprise any of mechanical movement, thermal or stress induced refractive index change in the filter.

Any of the laser, optical filter and any third reflector may be optically connected at least partially by free space light propagation.

The laser, optical filter and any third reflector may be optically connected at least partially by one or more optical fibres.

The laser, optical filter and any third reflector may be optically connected at least partially by one or more integrated optical waveguides.

The optical phase control section may be configured to receive a current or voltage and provide a change in refractive index of the phase control section in response to the received current or voltage.

The optical source may further comprise an optical detector optically coupled to any of: a laser output; an output from the optical filter; a transmitted portion of a third optical reflector.

The detector may be optically coupled to the filtered output of the optical filter.

The detector may be configured to receive light from the source and generate one or more electrical signals; and, the phase control section may be configured to receive electrical signals, based at least in part upon the detector electrical signals, for changing the refractive index of the phase section.

The optical source may further comprise electronic processing means configured to: receive said detector electrical signals; process the said detector signals and, transmit processed electrical signals to the phase control section.

There is further presented a low-cost semiconductor laser source (Fabry-Perot laser) to form a wavelength controlled, DWDM optical source, by using a longitudinal mode frequency tuning element in the laser chip and self-injection locking the laser to a local optical filter. The local filter can be athermalised such that the frequency of the source does not show a large variation in frequency over an extended temperature range. The frequency of the laser longitudinal modes is monitored and separately controlled via the phase section so that at least one longitudinal mode is injection locked over the extended temperature range.

BRIEF DESCRIPTION OF THE DRAWINGS

Embodiments of the present invention will now be described in detail with reference to the accompanying drawings, in which.

DETAILED DESCRIPTION

Figure 1:
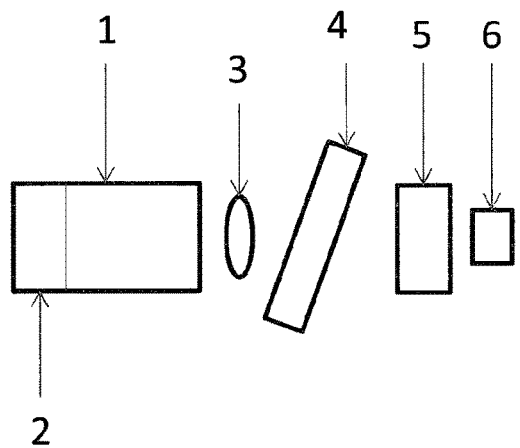
FIG. 1 shows the laser chip 1 with phase control section 2

Optical sources are presented configured to output laser light. The optical sources preferably output light in the wavelength range between 1530-1565 nm (otherwise known as the C-band), but may in principle output laser light in any one or more of the following wavelength ranges: 1260 to 1360 nm (otherwise known as the O band), 1360 to 1460 nm (otherwise known as the E band), 1460 to 1530 nm (otherwise known as the S band), 1565 to 1625 nm (otherwise known as the L band), 1625 to 1675 nm (otherwise known as the U band). Such wavelength ranges are preferably used for telecommunication applications. For sensor applications, the optical source can be configured in any optical wavelength band.

Preferably the optical sources are to be used for short haul optical networks, such as those with optical fibre spans not exceeding 20 km, however in principle the optical sources may be used for any optical data or communications or any other application requiring a thermally stable laser source.

The output from the optical sources is typically continuous wave (CW) light, although in principle the light output could be pulsed, for example by directly modulating the source injection current, or using any other suitable modulating means.

The laser comprises a first and second optical reflector. Any of the reflectors may be a mirror. Preferably both reflectors are mirrors. A laser cavity section is disposed between the said reflectors. The laser cavity section comprises at least one optical gain section comprising an optical gain medium such that light generated by the gain medium is configured to reflect off both mirrors to form a Fabry Perot laser. The laser cavity section also comprises a phase control section. The phase control section comprises a medium that is physically separate to the gain medium and is configured to be able to change the refractive index of at least part of the phase control section. Adjusting the refractive index of the phase control section in turn adjusts the longitudinal mode frequencies of the laser cavity. The phase control section may cause the refractive index change by any suitable means. The first and second optical reflectors being configured, together, to feed sufficient light back into the laser cavity section so that the laser can lase.

Such phase control means may include using a thermo optical effect, for example where a current is supplied to a heating element adjacent to the phase control medium. Additionally or alternatively carrier (current) injection into a phase control medium may cause the refractive index change.

Typically the phase control section comprises an electrical contact configured to apply a suitable current or voltage signal to the phase control medium of the phase control section to give rise to the desired refractive index change.

Preferably the gain section comprises a semiconductor gain medium.

Preferably the phase control section comprises a semiconductor phase control medium.

Any of the gain or phase control sections may comprise a plurality of different gain or phase control mediums respectively.

Preferably, any one or more of the semiconductor mediums comprise InP, or InGaAsP or AlInGaAs or InGaAs or any other suitable semiconductor material including quantum dots or organic semiconductors.

Preferably both the gain medium and phase control medium both comprise semiconductor material. The laser may be a semiconductor Fabry Perot laser.

Any of the sections of the laser may comprise a waveguide. Any such waveguide may be any of a rib waveguide, ridge waveguide, buried waveguide or any other suitable waveguide structure comprising suitable semiconductor and/or dielectric materials that provide the functionality required by each of the said sections.

For a phase control section using current injection, the semiconductor medium in the phase control section preferably comprises a larger band gap than the semiconductor medium in the gain section. In principle the bandgap of the phase control section may be any bandgap, for example the bandgap in the phase control section may be the same as the gain section.

Preferably the phase control section and gain section are separately electronically controlled such that the current or voltage applied to the gain control medium is not applied to the phase control medium and vice versa. The gain medium is preferably electronically coupled to two electrical contacts. The phase control medium is preferably electronically coupled to two electrical contacts. One of the contacts may be a common ground or anode shared with the gain section.

In principle the laser cavity section may comprise a plurality of gain sections and/or a plurality of phase control sections.

At least one of the first and second mirrors is partially reflecting in the wavelength range of interest. In principle, both of the mirrors may be partially reflecting. Preferably, a partially reflecting mirror reflects any of 80% to 99% of the light incident upon it, more preferably 85-95%. Preferably the reflectors reflect substantially the same amount of light across the wavelength range of operation such that the reflectors are broadband in optical response. Preferably the laser cavity comprises a semiconductor chip and the reflectors are physically attached to the ends of the chip, for example by coating the ends of the chip or by any other suitable means.

The optical source comprises a laser optically coupled to an external optical filter that feeds back filtered output laser light into the laser, thus forming an external optical cavity. The external optical cavity may comprise a further optical reflector that reflects filtered light back into the optical filter. The further reflector is at least a partial optical reflector, or can be an optical reflector that substantially reflects 100% of the light incident upon it in the wavelength range of source operation.

Figure 2:
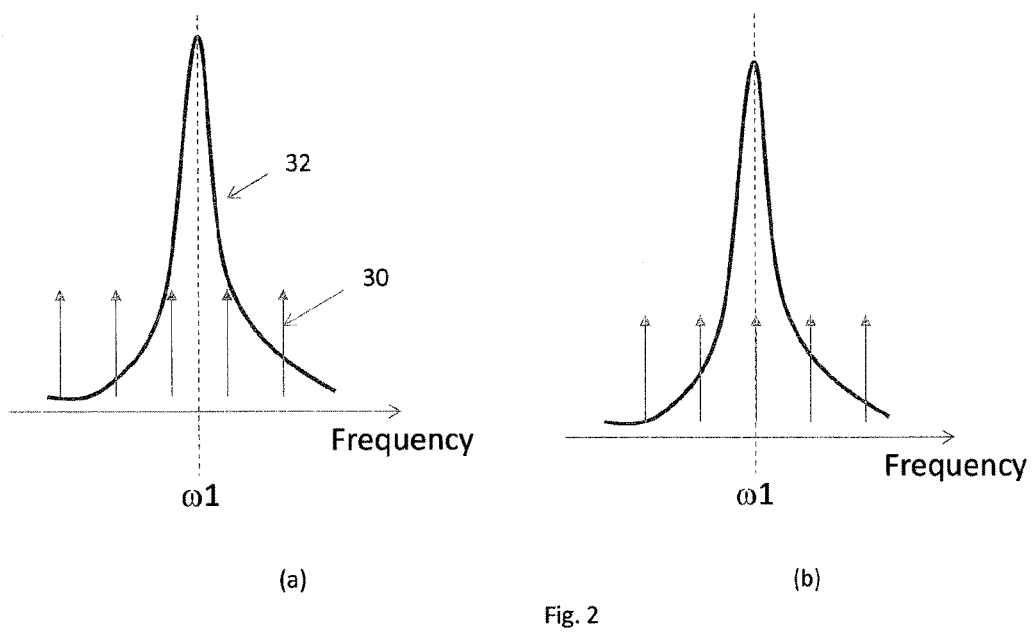
FIG. 2 shows the wavelength tuning of the laser modes.

The external optical cavity is optically coupled to the laser such that light exiting the laser from a partially reflecting reflector is incident upon the optical filter. The optical filter may be a single optical filter device or a plurality of optical filters with a combined optical filtering characteristic. The optical filter preferably comprises a pass band filtering characteristic as shown in FIG. 2.

The following examples may be modified or changed as described above.

In a first example, there is provided an optical source comprising a semiconductor laser coupled optically to a narrow bandpass optical filter and reflector, wherein the filtered optical reflection injection-locks the laser to operate at a single wavelength determined by the optical filter passband. The laser contains a method of longitudinal mode frequency tuning wherein the frequency of at least one of the laser modes can be tuned to the same frequency as the optical filter. This enables the optical source wavelength to be controlled in such a way that the laser source emits a single wavelength.

Preferably the laser is a Fabry-Perot semiconductor laser comprising at least two sections. The said laser is optically coupled to a narrow bandpass optical filter and a partial optical reflector. One section of the laser is used to control the optical gain of the laser chip, for example by injecting current into the said section, and the other section is used to vary the frequency and/or gain of the laser longitudinal modes. The phase control section and gain section are independently controllable. The bandpass of the optical filter is preferably narrower in frequency than the laser longitudinal mode spacing such that the filter only passes one of the laser longitudinal modes. The wavelength of the optical filter can be tuned, for example, by altering the angle of the filter with respect to the incident optical beam output from the laser. The optical filter is preferably a thin-film coated device coated on a plane parallel substrate such that the emergent angle of the optical beam is not deviated as the optical filter is angle tuned. The substrate for the coated filter is preferably a thermally compensated (athermalised) material such that the centre wavelength of the filter has a small variation with temperature, for example <3 pm/° C. In this embodiment, the wavelength of the optical source output can be maintained over temperature by controlling the phase section of the laser to vary the absolute frequency of the longitudinal modes. If the temperature range extends beyond the tuning range of a particular longitudinal mode, then an adjacent longitudinal mode can be used alternatively to comprise the optical source output. The Fabry-Perot cavity can also be athermalised by using an additional optical polymer waveguide section so that the longitudinal variation in mode frequency is controlled to be less than the mode frequency adjustment produced by controlling the phase section.

There is also presented a multi-wavelength optical source comprising a plurality of semiconductor lasers coupled optically to a multi-channel optical filter and common reflector, wherein the filtered optical reflection induces each laser to operate at a single and distinct wavelength determined by the optical filter frequency response. Each laser is configured to be able to tune the laser longitudinal mode frequency. The frequency of the laser modes of each laser can be tuned, independently of other lasers, to a particular central frequency of a passband of the multi-channel optical filter. Preferably each laser is tuned to a different passband central frequency of the filter. The Fabry-Perot laser cavity of any one or more of the lasers can also be athermalised by using an additional optical polymer waveguide section so that the longitudinal variation in mode frequency is controlled to be less than the mode frequency adjustment produced by controlling the phase section.

Preferably, a plurality of Fabry-Perot semiconductor lasers is provided, each comprising at least two sections. The said lasers are optically coupled to a multi-wavelength bandpass optical filter and a common partial reflector. One section of each laser is used to control the optical gain of the laser chip and the other section is used to vary the frequency (and gain) of each laser longitudinal modes. The bandpass of each channel of the multi-wavelength optical filter is preferably narrower in frequency than the laser longitudinal mode spacing such that the filter only passes one of the laser modes for each wavelength channel. The centre frequency of each channel of the multi-wavelength optical filter is determined by the design of the filter. The multi-wavelength optical filter is preferably thermally compensated such that the centre wavelength of each channel of the filter has a small variation with temperature. In this example the wavelength of the optical source output can be maintained over temperature by controlling the phase section of the laser to vary the absolute frequency of the longitudinal modes. If the temperature range extends beyond the tuning range of a particular longitudinal mode, then an adjacent mode can be used alternatively to comprise the optical source.

There is further provided an optical source with a plurality of lasers, optically coupled to a first optical filter and optical reflector wherein a second optical filter is inserted in the optical path between the lasers and the first optical filter to allow a predefined selection of wavelengths to be reflected back into the lasers.

FIG. 1 shows the laser chip 1 with phase control section 2 coupled optically via a lens 3 to an optical bandpass filter 4 and a partial reflector 5. The output beam from the laser can be collimated or focussed with a lens 3 to allow retro-reflection of part of the beam from the partial reflector 5. The intensity of the reflected light is designed such that the reflected beam self-injection locks the laser to a wavelength determined by the optical filter 4. An optical detector 6 after the partial reflector 5 can be used to monitor the frequency of a longitudinal mode with respect to the optical filter frequency as part of an electronic control loop. The filter 4 can be tuned by position, angle, temperature or electrically to vary the wavelength of the optical source. At each optical filter wavelength, the phase and frequency of the laser chip longitudinal modes are adjusted via the phase section 2 so that the frequency of one mode overlaps with the optical filter frequency. The optical filter 4 can be fabricated by thin-film deposition on a thermally matched substrate such that the variation in the centre frequency with temperature is below 3 pm/° C.

FIG. 2 shows the wavelength tuning of the laser modes 30 with respect to a bandpass filter at frequency ω1. FIG. 2 shows two graphs showing laser modes 30 of a laser and the frequency dependent bandpass characteristic 32 of the optical filter having a central bandpass frequency ω1.

The left hand graph of FIG. 2, with the label (a) underneath, shows none of the initial laser modes of the laser having a frequency equal to ω1.

The right hand graph of FIG. 2, with the label (b) underneath, shows the shift of the laser modes of the same laser via the tuning of the laser longitudinal modes by the phase section 8. In this second 'tuned' case, the laser modes have shifted such that one of the laser modes aligns with the central frequency ω1 of the external optical filter.

Figure 3:
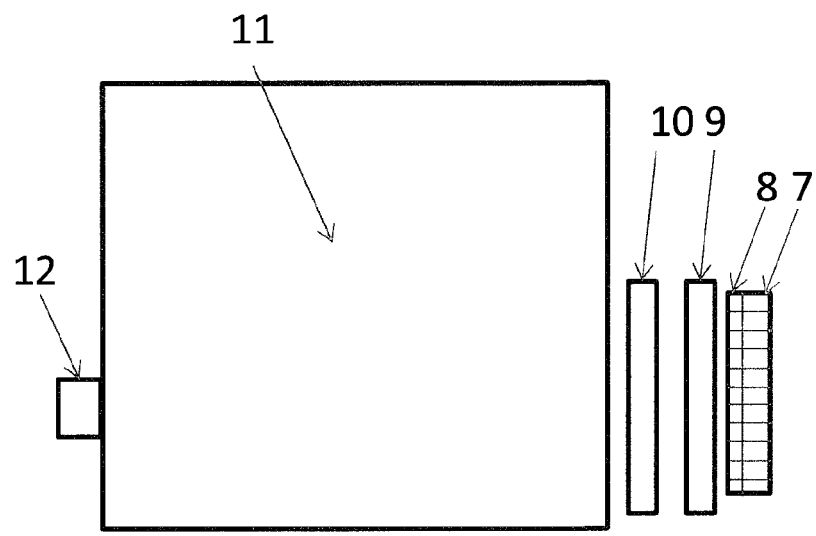
FIG. 3 shows a plurality of laser chips 7 with separate phase control sections 8

FIG. 3 shows a plurality of laser chips 7 with separate phase control sections 8 coupled optically via lens arrays 9, 10 to a multi-wavelength bandpass filter 11 and common partial reflector 12. Each laser chip is tuned via the phase section 8 so that one longitudinal mode overlaps in frequency with the fixed bandpass filter channels. The intensity of the reflected light from the common partial reflector 12 is designed such that the reflected beam self-injection locks each laser to a wavelength determined by the separate optical filter bandpass channels. The multi-wavelength bandpass filter 11 can be in the form of an optical waveguide device, such as an arrayed waveguide grating, or a free-space device such as an Eschelle grating. The multi-wavelength bandpass filter 11 has thermal compensation, such as mechanical movement or optical polymer infill, such that the centre wavelength of each filter channel has a low variation in centre frequency with temperature, for example below 3 pm/° C.

Figure 4:
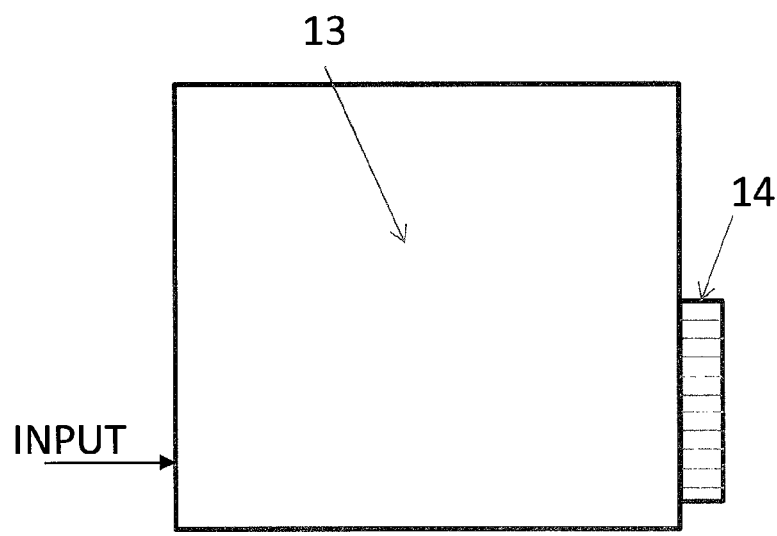
FIG. 4 shows how the wavelength of each laser chip source is monitored in power and frequency via one or more multi-wavelength bandpass filters

FIG. 4 shows how the wavelength of each laser chip source is monitored in power and frequency via one or more multi-wavelength bandpass filters 13 coupled optically to multiple monitor photodiodes 14. The optical bandpass frequencies of the monitor filters 13 are aligned or offset to the multi-wavelength bandpass filter 11 from the source.

Figure 5:
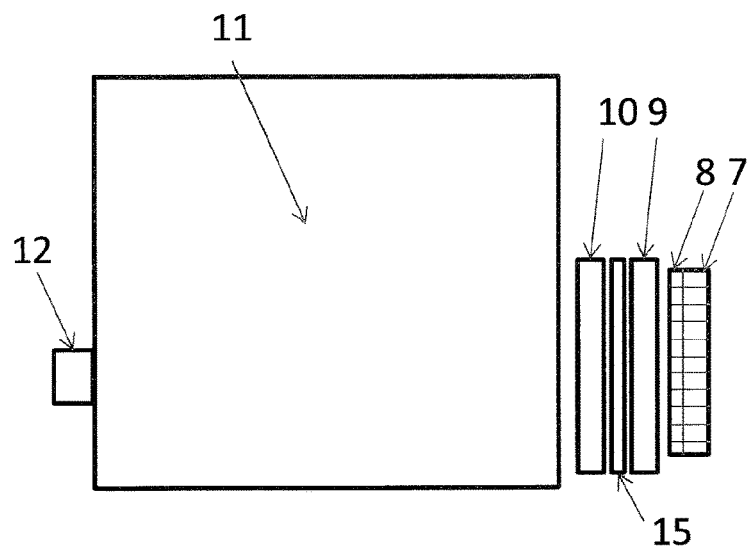
FIG. 5 shows a plurality of laser chips 7 with separate phase control sections 8 coupled optically via lens arrays 9, 10 to a multi-wavelength bandpass filter 11

FIG. 5 shows a plurality of laser chips 7 with separate phase control sections 8 coupled optically via lens arrays 9, 10 to a multi-wavelength bandpass filter 11, common partial reflector 12 and monitoring filters 13, where a separate optical filter 15 is inserted between the laser chips and the multi-wavelength bandpass filter 11. The filter 15 can be positioned between two sets of lens arrays 9, 10 such that the beam from the laser chips is collimated through the thin-film coated filter 15. The filter transmission response is designed to allow a defined range of wavelengths to be passed through the filter and hence select one or more wavelength ranges to be reflected back into the laser chips from the common partial reflector 12. For example, if the multi-wavelength bandpass filter 11 is an array waveguide grating, then the filter 15 can be used to select a single free-spectral range of the periodic array waveguide grating response. The filter 15 can be coated on a thermally matched substrate such that the variation in the optical filter response with temperature is small, for example below 3 pm/° C.

Figure 6:
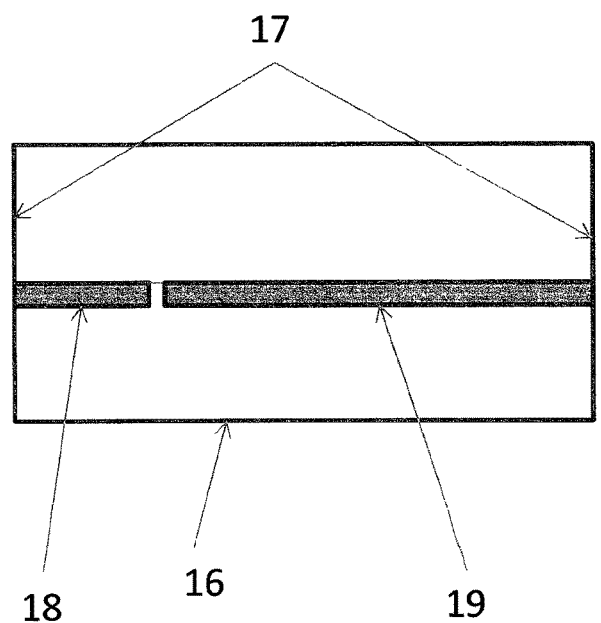
FIG. 6 shows the laser chip 16 with two reflecting mirrors 17 and two electrical contacts: one for the phase section 18 and one for the gain section 19.

FIG. 6 shows a preferred semiconductor laser chip structure 16 with reflecting mirrors 17 on each facet of the semiconductor laser. A separate electrical contact 18 is provided for the phase section and a separate electrical contact 19 is provided for the gain section. These contacts are fabricated over the optical waveguides of the laser chip device.

Features presented herein may include:
1. An optical source comprising a semiconductor laser optically coupled to a local optical filter and optical reflector, wherein the laser has a phase control section for tuning the laser longitudinal mode frequency with respect to the optical filter frequency.
2. An optical source according to feature 1 where the filter band-pass width is less than the longitudinal mode spacing of the semiconductor laser.
3. An optical source according to feature 2 where the source optical frequency is monitored to provide a feedback control signal to the phase control section of the semiconductor laser.
4. An optical source according to feature 3 where the semiconductor laser is directly modulated to produce optical data.
5. An optical source according to feature 4 where the wavelength of the source can be tuned using an optical tuning element.
6. An optical source according to feature 5 where the optical tuning element is athermalised to minimise the change in filter wavelength with temperature.
7. An optical source according to feature 3 where multiple semiconductor laser sources are optically coupled to a multiple-wavelength filter.
8. An optical source according to feature 7 where the multi-wavelength filter is athermalised to minimise the change in filter wavelength with temperature.
9. An optical source according to feature 8 where a wavelength selective filter is inserted in the optical path between the multiple semiconductor lasers and the multiple-wavelength filter.
10. An optical source according to features 1-9 where the current or voltage applied to the phase section on the semiconductor laser is used to compensate optical frequency changes produced by variations in the temperature of the laser chip.
11. An optical source according to features 1-10 where a thin-film coating is applied to the semiconductor laser facet to control the optical power injected back into the laser from the filtered self-injection section.

Embodiments of the present invention have been described with particular reference to the examples illustrated. However, it will be appreciated that variations and modifications may be made to the examples described within the scope of the present invention.

The invention claimed is:
1. An optical source comprising:
I) a laser cavity section disposed between a first optical reflector and a second optical reflector, the laser cavity section comprising:
A. an optical gain section; and,
B. an optical phase control section in optical communication with the gain section, and configured to be able to change the longitudinal mode frequency of the optical source; and,
II) an optical filter external to and in optical communication with the laser cavity section; wherein:
at least one of the first or second optical reflectors is a partial optical reflector;
the optical filter is configured to receive laser light from one of the said at least one partial optical reflectors and filter the said received light;
the optical source is configured to input filtered light into one of the said at least one partial optical reflectors;
the optical filter comprises an optical thin film filter comprising a passband filter response; and,
the optical source is configured to change the central wavelength of the passband response of the optical thin film filter by changing the angle of incidence that the output laser light subtends with the optical thin film filter.

2. The optical source as claimed in claim 1, wherein the optical phase control section is controllable independently from the gain section.

3. The optical source as claimed in claim 1, wherein:
the optical gain section comprises a semiconductor material; and
the optical phase control section comprises a semiconductor material comprising a larger band gap than the semiconductor material of the optical gain section.

4. The optical source as claimed in claim 1, wherein the first reflector is a partial reflector and is configured to:
output a portion of the laser light to the filter; and,
receive the filtered laser light from the filter;
and wherein the optical source further comprises a third optical reflector external to the laser and configured to:
receive filtered laser light from the optical filter; and,
reflect filtered laser light back towards the optical filter.

5. The optical source as claimed in claim 4, wherein the third optical reflector is a partial reflector such that it is configured to transmit a portion of the light as an output of the laser source.

6. The optical source as claimed in claim 1, wherein filter bandpass full width half maximum width is less than the longitudinal mode spacing of the laser.

7. The optical source as claimed in claim 1, comprising a plurality of said lasers, wherein the optical filter comprises a multi-wavelength optical filter comprising a plurality of optical pass-bands.

8. The optical source as claimed in claim 7, wherein:
I) the filter is configured to receive light from a plurality of physically separate light paths, wherein each said light path is associated with a different optical passband; and,
II) each of the plurality of lasers is in optical communication with a different light path.

9. The optical source as claimed in claim 8, wherein the optical filter comprises an arrayed waveguide grating (AWG).

10. The optical source as claimed in claim 9, wherein;
the optical source comprises a third optical reflector; and,
the AWG comprises a wavelength multiplexed output path in optical communication with the third reflector; and,
the third optical reflector is configured to receive filtered laser light from the multiplexed output of the AWG and reflect at least a portion of the said filtered light back into the multiplexed output of the AWG.

11. The optical source as claimed in claim 7, where a further optical filter is inserted in the optical path between, and in optical communication with, the plurality of lasers and the multi-wavelength filter.

12. The optical source as claimed in claim 1, wherein any one or more of the optical filter and laser are athermalised.

13. The optical source as claimed in claim 1, further comprising an optical detector optically coupled to any of:
a laser output;
an output from the optical filter;
a transmitted portion of a third optical reflector.

14. The optical source as claimed in claim 13, wherein the detector is optically coupled to the filtered output of the optical filter.

15. The optical source as claimed in claim 13, wherein:
I) the detector is configured to receive light from the source and generate one or more electrical signals; and,
II) the phase control section is configured to receive electrical signals, based at least in part upon the detector electrical signals, for changing the refractive index of the phase section.

* * * * *